United States Patent
Yamada et al.

(10) Patent No.: US 6,727,911 B1
(45) Date of Patent: Apr. 27, 2004

(54) METHOD AND APPARATUS FOR OBSERVING SPECIMEN IMAGE ON SCANNING CHARGED-PARTICLE BEAM INSTRUMENT

(75) Inventors: Atsushi Yamada, Tokyo (JP); Masaki Saito, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/563,080

(22) Filed: Apr. 24, 2000

(30) Foreign Application Priority Data

Apr. 28, 1999 (JP) ............................................ 11-121730

(51) Int. Cl.⁷ ................................................ H01J 37/26
(52) U.S. Cl. ...................... 345/649; 345/655; 345/656; 250/306; 250/311; 250/310; 382/286; 382/289; 382/291; 382/295; 382/296; 382/297
(58) Field of Search ................... 345/649, 655, 345/656, 657; 250/310, 307, 306, 309, 311; 382/276, 289, 216, 291, 293–297, 168

(56) References Cited

U.S. PATENT DOCUMENTS

| | | | |
|---|---|---|---|
| 4,020,343 A | * | 4/1977 | Shimaya et al. ............. 250/311 |
| 4,439,681 A | * | 3/1984 | Noriokaet al. ............. 250/310 |
| 4,627,009 A | * | 12/1986 | Holmes et al. ............. 364/559 |
| 4,803,358 A | * | 2/1989 | Kato et al. ................... 250/310 |
| 5,126,566 A | * | 6/1992 | Shimada ...................... 250/310 |
| 5,297,034 A | * | 3/1994 | Weinstein .................... 382/128 |
| 5,591,980 A | * | 1/1997 | Ogasawara et al. .... 250/442.11 |
| 5,670,782 A | * | 9/1997 | Sato ............................ 250/310 |
| 5,801,382 A | * | 9/1998 | Noda et al. .................. 250/310 |
| 5,834,774 A | * | 11/1998 | Negishi et al. ............. 250/310 |
| 6,072,625 A | * | 6/2000 | Kitahara et al. ............ 359/388 |
| 6,184,526 B1 | * | 2/2001 | Kohama et al. ............ 250/310 |
| 6,285,965 B1 | * | 9/2001 | Taenzer ....................... 702/155 |

* cited by examiner

Primary Examiner—Matthew Luu
Assistant Examiner—Daniel J Chung
(74) Attorney, Agent, or Firm—Webb Ziesenheim Logsdon Orkin & Hanson, P.C.

(57) ABSTRACT

Method and apparatus for observing a specimen image on a scanning charged-particle beam instrument in such a way that the original observational position can be automatically resumed after movement of a specimen or its image. When an image is observed at the original position after a specimen or its image is rotated or moved, a keyboard or a pointing device is operated to command reconstruction of the image. In response to this, the CPU of the instrument reads data from a memory that indicates the history of rotations and movements of the specimen and image. For example, if the specimen has been mechanically rotated, the CPU controls a rotational drive circuit according to the data read from the memory, the data indicating amounts and directions of rotations. The specimen stage is rotated through a given angle in a direction opposite to the previous direction. As a result, the specimen can be returned to the position assumed prior to the rotation.

12 Claims, 3 Drawing Sheets

METHOD AND APPARATUS FOR OBSERVING SPECIMEN IMAGE ON SCANNING CHARGED-PARTICLE BEAM INSTRUMENT

BACKGROUND OF THE INVENTION

1. Field of the Invention

The present invention relates to an instrument using scanning charged-particle technology, such as a scanning electron microscope and, more particularly, to a method and apparatus for observing a specimen in a tilted state on a scanning charged-particle beam instrument capable of mechanically moving a specimen and of electrically moving a scanned image.

2. Description of the Related Art

In a scanning electron microscope, an electron beam emitted from an electron gun is focused onto a specimen by condenser lenses and an objective lens. Furthermore, the electron beam is scanned in two dimensions. This results in secondary electrons and other electrons, which are detected by a detector. The output signal from the detector is supplied to a display unit synchronized with the scanning of the electron beam. In this way, a scanned image of the specimen is obtained.

When an image of the specimen is observed using such a scanning electron microscope, the specimen stage is mechanically translated in the X-and Y-directions or rotated to observe an image of a desired region on the specimen. The movement and rotation of the range in which the specimen is observed are not limited to mechanical methods. For example, image shift capabilities for controlling the range in which the electron beam is deflected or scan rotation capabilities for electrically rotating the direction in which the electron beam is scanned in two dimensions may also be employed.

Figure 1A:
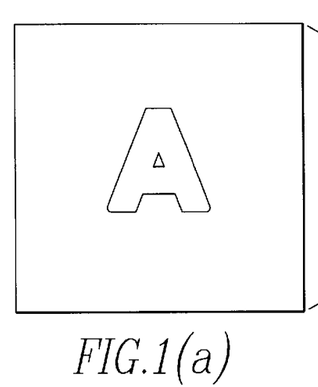
Figure 1B:
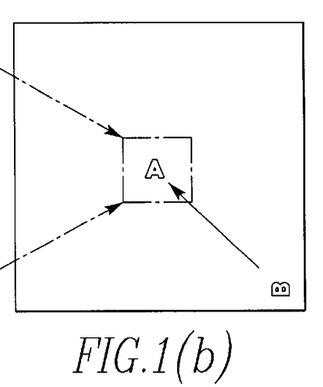
Figure 1C:
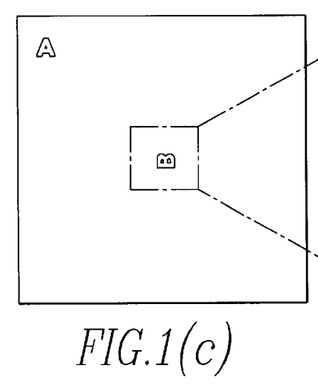
Figure 1D:
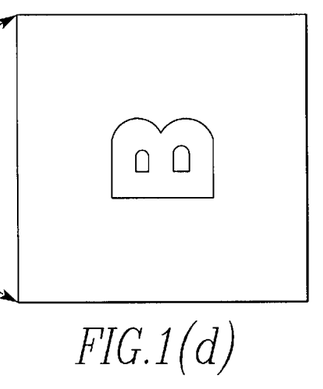
Figure 1E:
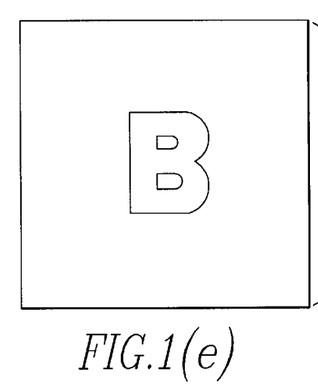

Prior to photographing or recording of a scanned image of a certain portion on a specimen or prior to analysis of the certain portion, an operator always preliminarily observes various portions on the specimen to search for portions adapted for photographing, analysis, or other purpose. FIGS. 1(a) to 1(f) show images observed on a scanning electron microscope (SEM). The operator has just finished a preliminary observation of a scanned image as shown in FIG. 1(a). Then, the operator lowers the magnification of the scanned image as shown in FIG. 1(b), and goes to an operation for searching for a portion to be observed next. The area surrounded by the dotted frame in FIG. 1(b) shows a field of view of FIG. 1(a) that has been observed. This portion is referred to as the portion A herein. It is now assumed that the operator selects a right lower portion of the frame of image as a portion to be observed next within the image of FIG. 1(b). This portion is referred to as the portion B. The operator drives the specimen stage to move the specimen in the direction indicated by the arrow in FIG. 1(b). That is, the specimen is moved toward the upper left corner to bring the portion B into the middle of the viewing screen. The result is shown in FIG. 1(c). Then, the magnification is increased. The result is shown in FIG. 1(d). The operator subsequently considers the compositional arrangement of the image within the frame of image and rotates the image through 90° in a clockwise direction. The result is shown in FIG. 1(e). In this way, the operator observes the portions A and B, and then he or she preliminarily observes portions C, D, etc. Finally, he or she selects some portions suitable for the purpose.

However, the operator might want to observe the portion A again during or after observation of the portion B in FIG. 1(e) for some other reason. This can take place frequently.

Figure 1F:
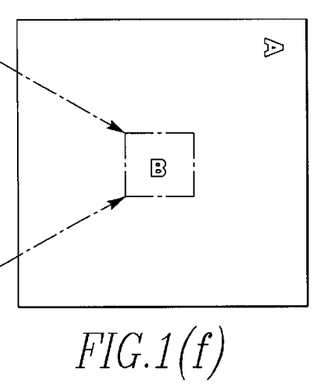

The operator remembers that he or she moved the specimen stage toward the upper left corner in going from portion A to portion B. Accordingly, he or she may perform a reverse operation, i.e., the specimen stage is moved toward the bottom left corner. However, one would easily understand that the portion A is not resumed by lowering the magnification of the scanned image and the state of FIG. 1(f) is assumed. As shown in FIG. 1(f), the portion A has already rotated through 90° in a clockwise direction and so has moved toward the upper right corner. Accordingly, in order to return to the portion A, the specimen stage must be rotated through 90° in a counterclockwise direction and then moved toward the lower right corner. Alternatively, the specimen stage must be moved toward the left bottom corner and then rotated through 90° in a counterclockwise direction. Such a misunderstanding tends to occur where a rotational operation is involved.

In the description provided thus far, the shown images are such that the portion A can be easily found simply by lowering the magnification of the scanned image as shown in FIG. 1(f) for ease of illustration. On actual specimens, however, scanned images are not viewed as simply as shown in FIGS. 1(a)–1(f). Preliminary observations of portions C, D, etc. are performed, and then the operator wants to return to observations of some earlier portions. Consequently, reproduction is not easy to achieve. In the. description above, the operator observed the portion A in FIG. 1(a) and judged that the portion A was not suitable for the purpose. In spite of this, he or she wants to observe the portion A again. Hence, the reproduction is more difficult to accomplish.

During actual observation of scanned images, the specimen position is shifted by moving the specimen stage in the X-and Y-directions mechanically. If necessary, rotation is added. For fine adjustment, the scanned image is moved in the X-and Y-directions by image shift capabilities. Often, the image is rotated by scan rotation capabilities by taking account of the compositional arrangement of the scanned image.

As mentioned previously, where the operator wants to observe an original image after moving the image, complex operations are often involved.

SUMMARY OF THE INVENTION

It is an object of the present invention to provide a method and apparatus for observing specimen images on a scanning charged-particle beam instrument in such a way that a specimen or a specimen stage can be returned to its original observational position automatically and accurately after the specimen or stage is moved.

A method of observing a specimen image on a scanning charged-particle beam instrument in accordance with a first embodiment of the present invention starts with preparing the scanning charged-particle beam instrument having a specimen stage capable of mechanical X-and Y-translations and rotation. A specimen is placed on the specimen stage. A charged-particle beam is directed to the specimen and scanned across the specimen in two dimensions, producing a signal. Based on this signal, a scanned image of the specimen is displayed. A scanning signal for the charged-particle beam is controlled to rotate the direction of the two-dimensional scan (referred to as the scan rotation capabilities). The range in which the charged-particle beam is scanned is shifted (referred to as the image shift capabilities). Then, the amounts of mechanical movements of the specimen in the X-and Y-directions and rotational movement of the specimen in going from a certain observational position to a next observational position are stored in memory. If the image is rotated or shifted at the next observational position using the scan rotation capabilities or image shift capabilities, information about the angular position or amount of shift of the image is stored in memory. If an observation is made at a given position, the image previously obtained at the given position is automatically reproduced, based on stored information about the angular position of the image owing to the scan rotation capabilities, image shift capabilities, and based on information about the amount of shift, the amount of movements in the X-and Y-directions, and the amount of rotation.

A method of observing a specimen image on a charged-particle beam instrument in accordance with a second embodiment of the present invention is based on the first embodiment described above and further characterized as follows. Whenever the specimen is moved from a certain observational position to plural other observational positions, if the image is rotated and shifted at plural observational positions using the amounts of mechanical movements of the specimen in the X-and Y-directions, the amount of rotation, the scan rotation capabilities, and image shift capabilities, then information about the angular position and the amount of shift of the image is stored in memory. Where an observation is made at any one of the plural observational positions, the image at this position is automatically reproduced, based on stored information about the angular position of the image owing to the scan rotation capabilities, image shift capabilities, information about the amount of shift, the amount of movements in the X-and Y-directions, and the amount of rotation. Any one of plural images previously observed can be easily reproduced.

A method of observing a specimen image on a charged-particle beam instrument in accordance with a third embodiment of the present invention is based on the second embodiment described above and further characterized as follows. The history of observational positions is displayed on the image currently being observed. Based on the display of the history, the image at the desired observational position can be easily reproduced.

A fourth embodiment of the present invention provides a scanning charged-particle beam instrument comprising: means for directing a charged-particle beam to a specimen placed on a specimen stage capable of being mechanically moved in the X-and Y-directions and of being rotated; means for scanning the charged-particle beam across the specimen in two dimensions; means for detecting resulting electrons to produce a detector output signal; means for displaying a scanned image of the specimen based on the detector output signal; means having scan rotation capabilities for controlling a scanning signal for the charged-particle beam to rotate the direction of the two-dimensional scan; means having image shift capabilities for shifting a range in which the charged-particle beam is scanned; and a memory for storing the amount of movements in the X-and Y-directions and the amount of rotation of the specimen in going from a certain observational position to a next observational position. If the image is rotated or shifted using the scan rotation capabilities or image shift capabilities at the next observational position, information about the amount of the angular position or the amount of shift is stored in the memory. Where an observation is made at the certain position, the image in the certain position is automatically reproduced, based on stored information about the angular position of the image owing to the scan rotation capabilities, image shift capabilities, information about the amount of shift, the amount of movements in the X-and Y-directions, and the amount of rotation.

A scanning charged-particle beam instrument in accordance with a fifth embodiment of the present invention is based on the fourth embodiment described above and further characterized as follows. Whenever the specimen is mechanically moved from a certain observational position to plural other observational positions, if the image is rotated and shifted at the plural observational positions using the amounts of mechanical movements of the specimen in the X-and Y-directions, the amount of rotation, the scan rotation capabilities, and image shift capabilities, then information about the angular position and the amount of shift of the image is stored in memory. Where an observation is made at any one of the plural observational positions, the image at this position is automatically reproduced, based on stored information about the angular position of the image owing to the scan rotation capabilities, image shift capabilities, information about the amount of shift, the amount of movements in the X-and Y-directions, and the amount of rotation. Any one of plural images previously observed can be easily reproduced.

A scanning charged-particle beam instrument in accordance with a sixth embodiment of the present invention is based on the fifth embodiment described above and further characterized as follows. The history of observational positions is displayed on the image currently being observed. Based on the display of the history, the image at the desired observational position can be easily reproduced.

Other objects and features of the invention will appear in the course of the description thereof, which follows.

BRIEF DESCRIPTION OF THE DRAWINGS

FIGS. 1(*a*) to 1(*f*) are views illustrating movements and rotations of an image observed on a charged-particle beam instrument in accordance with the present invention;

DESCRIPTION OF THE PREFERRED EMBODIMENTS

Figure 2:
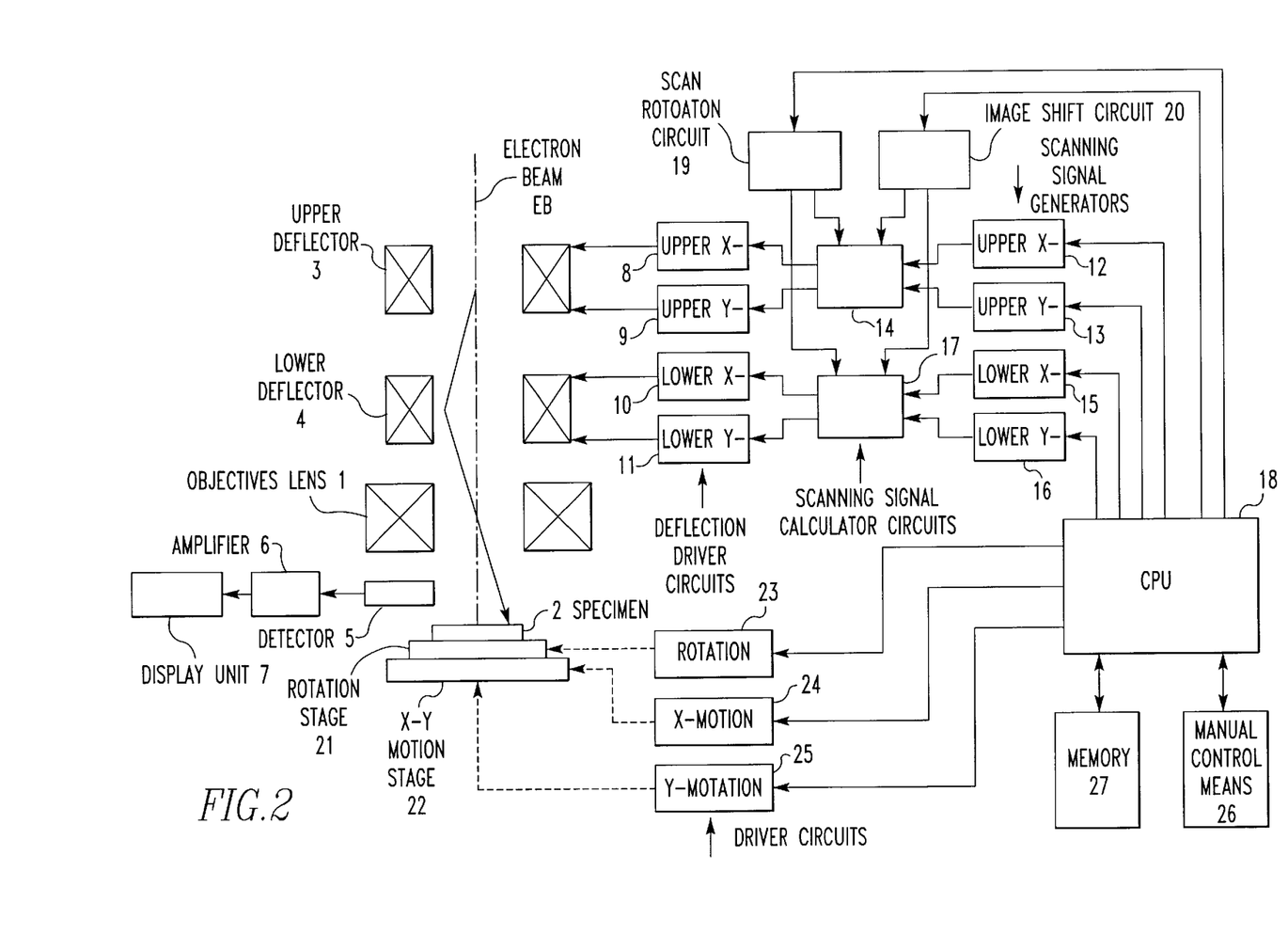
FIG. 2 is a diagram of a scanning electron microscope for carrying out a method in accordance with the present invention.

The preferred embodiments of the present invention are hereinafter described with reference to the accompanying drawings. FIG. 2 shows one example of scanning electron microscope for carrying out a. method in accordance with the present invention. This microscope has an electron gun (not shown) emitting an electron beam EB, which is accelerated and sharply focused onto a specimen 2 by condenser lenses (not shown) and an objective lens 1. The beam is scanned in two dimensions within a desired region on the specimen 2 by an upper deflector 3 and a lower deflector 4.

The electron beam EB hits the specimen 2, producing secondary electrons, which are detected by a secondary electron detector 5. The output signal from the detector 5 is fed via an amplifier 6 to a display unit 7 synchronized with the scanning of the electron beam. As a result, a scanned image of the specimen is displayed on the display unit 7.

Deflection signals for scanning of the electron beams are supplied from an upper X-deflection driver circuit 8 and from an upper Y-deflection driver circuit 9 to the upper deflector 3 comprised of an X-coil and a Y-coil. Deflection signals for the scanning of the electron beam are supplied to the lower deflector 4 comprised of an X-coil and a Y-coil from a lower X-deflection driver circuit 10 and from a lower Y-deflection driver circuit 11.

Scanning signals produced by an upper X-scanning signal generator 12 and an upper Y-scanning signal generator 13 are supplied to the upper X-deflection driver circuit 8 and the upper Y-deflection driver circuit 9, respectively, via a scanning signal calculator circuit 14. Scanning signals produced by a lower X-scanning signal generator 15 and a lower Y-scanning signal generator 16 are supplied to the lower X-deflection driver circuit 10 and the lower Y-deflection driver circuit 11, respectively, via a scanning signal calculator circuit 17. The scanning signal generators 12, 13, 15, and 16 are controlled by a CPU 18.

An image rotation signal is supplied from a scan rotation circuit 19 to the calculator circuits 14 and 17, where the scanning signals are arithmetically processed. An image shift signal is supplied from an image shift circuit 20 to the calculator circuits 14 and 17, where the scanning signals are arithmetically processed. The scan rotation circuit 19 and the image shift circuit 20 are controlled by the CPU 18.

A specimen 2 is placed on a rotating stage 21, which in turn is mounted to an X-Y motion stage 22. The rotating stage 21 is rotated on the X-Y motion stage 22 by a rotational drive circuit 23. The X-Y motion stage 22 can be translated in the X-and Y-directions by an X-motion driver circuit 24 and a Y-motion driver circuit 25, respectively.

The rotational drive circuit 23, the X-motion driver circuit 24, and the Y-motion driver circuit 25 are controlled by the CPU 18, which is connected with manual control device 26, such as a keyboard and a pointing device. A memory 27 is connected with the CPU 18. The contents of various control operations performed by the CPU 18 are stored in the memory 27. An example of the contents of the memory 27 indicating the various control operations is shown in Tables I and II. The Tables I and II will be described later. The operation of the instrument constructed in this way is described now.

TABLE I

| observational condition number | specimen stage | | | image shift | | scan rotation | magnifications |
| --- | --- | --- | --- | --- | --- | --- | --- |
| | X-coordinates | Y-coordinates | rotating coordinates | X-coordinates | Y-coordinates | | |
| 1 | 12.123 mm | 56.789 mm | 0° | 0.00 μm | 0.00 μm | 0° | 300 |
| 2 | 12.123 mm | 56.789 mm | 0° | 0.00 μm | 0.00 μm | 0° | 1000 |
| 3 | 12.123 mm | 56.789 mm | 0° | 12.3 μm | −5.67 μm | 0° | 1000 |
| 4 | 12.123 mm | 56.789 mm | 0° | 12.3 μm | −5.67 μm | 0° | 3000 |
| 5 | 34.345 mm | 11.234 mm | 0° | 12.3 μm | −5.67 μm | 0° | 3000 |
| 6 | 34.345 mm | 11.234 mm | −30° | 12.3 μm | −5.67 μm | 0° | 3000 |
| 7 | 34.345 mm | 11.234 mm | −30° | −4.56 μm | −0.12 μm | 0° | 3000 |
| 8 | 34.345 mm | 11.234 mm | −30° | −4.56 μm | −0.12 μm | 0° | 5000 |
| 9 | 34.345 mm | 11.234 mm | −30° | −4.56 μm | −0.12 μm | 45° | 5000 |

TABLE II

| specimen position numbers | specimen stage | | | image shift | | scan rotation | magnifications |
| --- | --- | --- | --- | --- | --- | --- | --- |
| | X-coordinates | Y-coordinates | rotating coordinates | X-coordinates | Y-coordinates | | |
| 1 | 12.123 mm | 56.789 mm | 0° | 12.3 μm | −5.67 μm | 0° | 3000 |
| 2 | 34.345 mm | 11.234 mm | −30° | −4.56 μm | −0.12 μm | 45° | 5000 |
| 3 | 50.505 mm | 50.050 mm | −30° | 0.78 μm | 6.78 μm | −90° | 3000 |
| 4 | 76.543 mm | 30.030 mm | −30° | 9.01 μm | 7.89 μm | 90° | 10000 |

Where a secondary electron image is observed, the magnification is set to a desired value by the use of the manual control means 26. According to this set magnification, the CPU 18 controls the upper X-scanning signal generator 12, the upper Y-scanning signal generator 13, the lower X-scanning signal generator 15, and the lower Y-scanning signal generator 16 to cause the scanning circuits to produce scanning signals corresponding to the magnification.

The scanning signal X1 from the upper X-scanning signal generator 12 is fed to the upper X-deflection driver circuit 8 via the scanning signal calculator circuit 14, so that a deflection signal is supplied to the X-coil in the upper deflector 3 from the upper X-deflection driver circuit 8. The scanning signal Y1 from the upper Y-scanning signal generator 13 is supplied to the upper Y-deflection driver circuit 9 via the calculator circuit 14, and a deflection signal is fed to the Y-coil in the upper deflector 3 from the upper Y-deflection driver circuit 9.

The scanning signal X2 from the lower X-scanning signal generator 15 is supplied to the lower X-deflection driver circuit 10 via the calculator circuit 17. A deflection signal is supplied to the X-coil in the lower deflector 4 from the lower X-deflection driver circuit 10. The scanning signal Y2 from the lower Y-scanning signal generator 16 is supplied to the lower deflection driver circuit 11 via the calculator circuit 17. A deflection signal is supplied to the Y-coil in the lower deflector 4 from the lower Y-deflection driver circuit 11.

As the aforementioned scanning signals are supplied to the deflectors, the electron beam EB is scanned in two dimensions within a desired range on the specimen 2. This illumination gives rise to secondary electrons, which are detected by the secondary electron detector 5. The output signal from the detector 5 is amplified by the amplifier 6, and then supplied to the display unit 7 synchronized with the two-dimensional scan of the electron beam EB. As a result, a secondary electron image of the specimen is displayed on the display unit 7.

Where the specimen 2 is mechanically rotated and its image is observed, the manual control means 26 are operated to indicate the amount of rotation or other amount. In response to the instruction, the CPU 18 controls the rotational drive circuit 23 to rotate the rotating stage 21 through a given angle in a desired direction. By performing these operations, the specimen is mechanically rotated and its image is observed. At this time, data, such as the amount of mechanical rotation and the direction of rotation, is sent from the CPU 18 to the memory 27, where the data is stored. An example of this data is given in the column of the "rotating coordinates" of the specimen stage in Table I.

If the specimen is then mechanically moved in the X-and Y-directions, the manual control device 26 is operated to indicate amounts of movements in the X-and Y-directions. In response to these amounts, the CPU 18 controls the X-motion driver circuit 24 and the Y-motion driver circuit 25 to cause the X-Y motion stage 22 to move a given distance in a given direction. By performing these operations, the specimen 2 is mechanically moved and its image is observed. At this time, data about the amounts of movements in the X-and Y-directions is sent from the CPU 18 to the memory 27, where the data is stored. An example of this data is given in the column of the "X-and Y-coordinates" of the specimen stage in Table I.

It is now assumed that an image of the specimen 2 is electrically rotated and its image is observed. The manual control device 26 is operated to command electrical rotation of the image and its amount of rotation. In response to this, the CPU 18 controls the scan rotation circuit 19, which in turn produces a rotation signal (e.g., angular distance $\theta$ or $\sin \theta$ and $\cos \theta$) corresponding to the amount of rotation. The rotation signal is supplied to the calculator circuits 14 and 17, which in turn calculate scanning signals. For example, the calculated scanning signal supplied from the calculator circuit 14 to the upper X-deflection driver circuit 8 is $X1 \cos \theta + Y1 \sin \theta$. The calculated scanning signal supplied from the calculator circuit 14 to the upper Y-deflection driver circuit 9 is $-X1 \sin \theta + Y1 \cos \theta$.

The scanning signals calculated from the rotation signal are supplied to the upper deflector 3 and the lower deflector 4 via the deflection driver circuits 8, 9, 10, and 11 and, therefore, the direction of the two-dimensional scanning of the electron beam EB on the specimen 2 rotates. A rotated image can be observed on the display unit 7. At this time, data about the electrical image rotation is sent from the CPU 18 to the memory 27, where the data is stored. An example of this data is given in the column of the "scan rotation" in Table I.

It is now assumed that an image of the specimen 2 is electrically shifted and an observation is made. The manual control device 26 is operated to command electrical shift of image and the amount of shifts in the X-and Y-directions. In response to this, the CPU 18 controls the image shift circuit 20, which in turn produces an image shift signal to the calculator circuits 14 and 17. These calculator circuits calculate the amounts of shifts in the X-and Y-directions and scanning signals to cause the image to move distances corresponding to these amounts of shifts.

Since the original scanning signals and signals indicating the calculated amounts of shifts in the X-and Y-directions are supplied to the upper deflector 3 and the lower deflector 4 via the deflection driver circuits 8, 9, 10, and 11, the direction of two-dimensional scanning of the electron beam EB on the specimen 2 varies to desired X-and Y-directions. As a result, the observed image on the display unit 7 is shifted by a given amount. At this time, data about the electrical shift of image is sent from the CPU 18 to the memory 27, where the data is stored. An example of this data is given in the column of the "image shift" in Table I.

By performing these operations, a rotated image or an image moved in the X- or Y-direction can be observed. After the image is rotated or moved and the specimen is observed in this way, if an image is observed at the original position, the manual control device 26 is operated to command reconstruction of images. In response to this instruction, the CPU 18 reads data about the history of rotations and movements of images and data about the history of rotations and movements of the specimen from the memory 27.

For example, if the specimen 2 has been mechanically rotated, the CPU 18 controls the rotational drive circuit 23 according to the data read from the memory 27 that indicates the amount and direction of rotation. The rotating stage 21 is rotated through a given angle in a direction opposite to the previous direction. As a result, the specimen position can go back to the position assumed prior to the rotation.

If the specimen 2 has been mechanically moved, the CPU 18 controls the X-motion driver circuit 24 and the Y-motion driver circuit 25 according to the data read from the memory 27, the data indicating the amounts of X- and Y-motions and the direction of movement. The X-Y motion stage 22 is caused to move a given distance in a direction opposite to the previous direction. In consequence, the specimen can go back to the position taken prior to the X- and Y-motions.

If the specimen image has been electrically rotated by the scan rotation capabilities, the CPU 18 controls, the scan rotation circuit 19 according to the data read from the memory 27, the data indicating the amount and direction of rotation. The original scan rotation signal is resumed. Consequently, the electrical rotation of the specimen image can resume its original state.

If the specimen image has been electrically shifted in the X- or Y-direction by the image shift capabilities, the CPU 18 controls the image shift circuit 20 according to the data read from the memory 27, the data indicating the amount and direction of movement. The original image shift signal is resumed. As a result, the electrical X- or Y-motion of the specimen image returns to its original state.

As described thus far, if the operator wants to observe the original specimen image again after the specimen is mechanically moved or its image is shifted or rotated electrically during observation of specimen images, the original image can be regained by simple operations. This can greatly improve the operability of the scanning electron microscope.

During observation of SEM images, there is a demand for a method of enabling reobservation at previous observational positions after observations at plural specimen positions are made in turn, as mentioned previously. In this case, if observational conditions at plural specimen positions are stored in the memory 27 as shown in Table II, images at previously used observational positions can be restored at any time.

Tables I and II are described in detail. Some conceivable methods exist of using the tables. A first method is to give a new number to every new set of observational conditions whenever the operator varies the observational conditions, i.e., some of the contents of the tables, as shown in Table I.

Thus, consecutive numbers are given to new sets of observational conditions. The contents of each item are put in the table. With this method, all observational conditions can be reconstructed. However, the contents of the reconstruction are too detailed and so the operator may feel that the operations for the reconstruction are cumbersome.

A second method is to assign consecutive numbers to new specimen positions, and the contents of each item are put into the table only when the operator varies the specimen stage, as shown in Table II. With respect to the contents of items other than the specimen stage, only the final set of observational conditions at the specimen stage positions is left. With this method, the final observational conditions at each specimen position can be reconstructed. This can prevent cumbersome operations, unlike the first method. However, detailed observational conditions might not be reconstructed.

A third method is a combination of the first and second methods described above as shown in Table III.

secondary electrons are detected. Backscattered electrons may also be detected. In the description made above, images are rotated and translated in the X- and Y-directions. Combinations of rotations, translations, and magnifications of scanned images may be stored in memory, and original images may be reconstructed (see tables). In addition, combinations of these parameters with beam currents may be stored in memory, and original images may be reconstructed. That is, depending on portions of a specimen under observation, the operator may want to vary the beam current impinging on the specimen during observation. For instance, where it is better to change a secondary electron image into a backscattered electron image in some portion of the specimen, the beam current may be switched to values appropriate for observation relying on backscattered electron images. In the description made above, scanning signals and image shift signals are arithmetically processed and supplied to deflectors. Separate deflectors for image shift may also be provided.

TABLE III

| specimen position numbers | observational condition numbers | specimen stage | | | image shift | | scan rotation | magnifications |
|---|---|---|---|---|---|---|---|---|
| | | X-coordinates | Y-coordinates | rotating coordinates | X-coordinates | Y-coordinates | | |
| 1 | 1 | 12.123 mm | 56.789 mm | 0° | 0.00 μm | 0.00 μm | 0° | 300 |
| 1 | 2 | 12.123 mm | 56.789 mm | 0° | 0.00 μm | 0.00 μm | 0° | 1000 |
| 1 | 3 | 12.123 mm | 56.789 mm | 0° | 12.3 μm | −5.67 μm | 0° | 1000 |
| 1 | 4 | 12.123 mm | 56.789 mm | 0° | 12.3 μm | −5.67 μm | 0° | 3000 |
| 2 | 5 | 34.345 mm | 11.234 mm | 0° | 12.3 μm | −5.67 μm | 0° | 3000 |
| 2 | 6 | 34.345 mm | 11.234 mm | −30° | 12.3 μm | −5.67 μm | 0° | 3000 |
| 2 | 7 | 34.345 mm | 11.234 mm | −30° | −4.56 μm | −0.12 μm | 0° | 3000 |
| 2 | 8 | 34.345 mm | 11.234 mm | −30° | −4.56 μm | −0.12 μm | 0° | 5000 |
| 2 | 9 | 34.345 mm | 11.234 mm | −30° | −4.56 μm | −0.12 μm | 45° | 5000 |
| 3 | 10 | 50.505 mm | 50.050 mm | −30° | −4.56 μm | −0.12 μm | 45° | 5000 |
| 3 | 11 | 50.505 mm | 50.050 mm | −30° | −4.56 μm | −0.12 μm | 45° | 3000 |
| 3 | 12 | 50.505 mm | 50.050 mm | −30° | 0.78 μm | 6.78 μm | −90° | 3000 |
| 4 | 13 | 76.543 mm | 30.030 mm | −30° | 0.78 μm | 6.78 μm | −90° | 3000 |
| 4 | 14 | 76.543 mm | 30.030 mm | −30° | 0.78 μm | 6.78 μm | −90° | 10000 |
| 4 | 15 | 76.543 mm | 30.030 mm | −30° | 9.01 μm | 7.89 μm | 90° | 10000 |

In this case, it is possible to make the best use of the merits of the first and second methods. Furthermore, the drawback can be compensated for.

Figure 3:
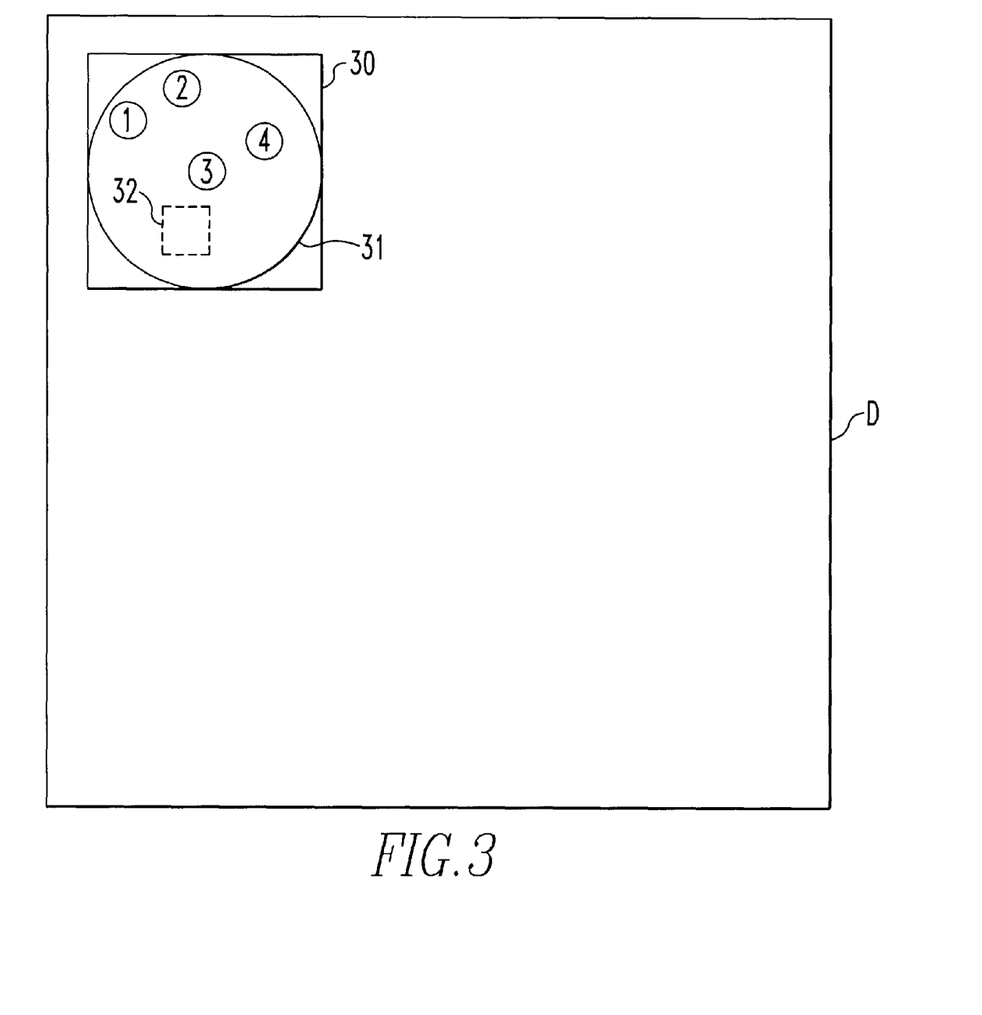
FIG. 3 is a view illustrating one example of display of the history of observational positions of image, the display being provided in accordance with one embodiment of the present invention.

The contents of the tables may be reset when the specimen is exchanged with a new one.

Where image observation is made at plural positions, it is advantageous to design the instrument in such a way that the operator can recognize the history of movement of the image from the viewing screen of the display unit 7. FIG. 3 shows one example of an image displayed on the viewing screen of the display unit 7. A motion history frame 30 for observational positions is set within the viewing screen D. A specimen or specimen holder 31 is displayed within the history frame 30. A presently observed specimen region 32 is displayed within the displayed specimen 31. Also, numbers (1)–(4) indicating the history of motions are shown. Hence, the observer can easily notice an image at a desired one of previous observational positions by referring to the shown history of motions.

While the preferred embodiments of the present invention have been described in detail thus far, the invention is not limited thereto. For example, in the above embodiments, a scanning electron microscope is taken as an example. The invention can also be applied to an instrument in which an ion beam is scanned to obtain a scanned image of a specimen. Furthermore, in the embodiments described above,

Having thus described our invention with the detail and particularity required by the Patent Laws, what is desired protected by Letters Patent is set forth in the following claims.

What is claimed is:

1. A method of observing a specimen image using a scanning charged-particle beam instrument having a specimen stage capable of mechanical X- and Y-motions and rotation, said specimen stage holding a specimen thereon, said specimen being illuminated with a charged-particle beam that is scanned in two dimensions across said specimen, said instrument being designed to display a scanned image according to a signal obtained in response to the illumination of the charged-particle beam, said instrument having scan rotation capabilities for rotating the direction of the two-dimensional scan by controlling a scanning signal for said charged-particle beam, said instrument having image shift capabilities for shifting a range in which said charged-particle beam is scanned, said method comprising the steps of:

displaying a first scanned image at a first X-Y observational position on the specimen said first scanned image having a first rotational orientation;

storing specimen stage X- and Y-direction and rotation information at said first observational position;

storing scan shift and rotation information of said first scanned image at said first observational position;

displaying a second scanned image at a second observational position on the specimen, said second scanned image having a second rotational orientation;

storing specimen stage X- and Y-direction and rotation information at said second observational position;

storing scan shift and rotation information of said second scanned image at said second observational position;

instructing return from said second to said first observational position; and automatically returning to said first observational position and displaying a scanned image which has said first rotational orientation according to the stored information about the angle of rotation of the image, the amount of shift, and specimen stage X- and Y-direction and rotation information.

2. A scanning charged-particle beam instrument comprising:

means for directing a charged-particle beam to a specimen placed on a specimen stage capable of being mechanically moved in the X- and Y-directions and of being rotated;

means for scanning the charged-particle beam across the specimen in two dimensions;

means for detecting resulting electrons to produce a detector output signal;

means for displaying first and second scanned images at first and second X-Y observational positions and having first and second rotational orientations, respectively, of the specimen based on the detector output signal;

means having scan rotation capabilities for controlling a scanning signal for the charged-particle beam to rotate the direction of the two-dimensional scan;

means having image shift capabilities for controlling a scanning signal for shifting a range in which the charged-particle beam is scanned;

memory for storing specimen stage X- and Y-direction and rotation information at said first and second observational positions;

memory for storing scan shift and rotation information at said first and second scanned images at said first and second observational positions; and control means for instructing return from said second to said first observational position, and controlling the specimen stage, the scan rotation and image shift, based upon data stored in said memories, said control unit controlling in such manner that, if the instruction which instructs to return to said first position is received, the observational position is returned to said first position and a scanned image which has said first rotational orientation is displayed based on stored information about stage position and amounts of rotation and shift owing to the scan rotation capabilities and image shift capabilities.

3. A method of observing a specimen image using a scanning charged-particle beam instrument having a specimen stage capable of mechanical X- and Y-motions and rotation, said specimen stage holding a specimen thereon, said specimen being illuminated with a charged-particle beam that is scanned in two dimensions across said specimen, said instrument being designed to display a scanned image according to a signal obtained in response to the illumination of the charged-particle beam, said instrument having scan rotation capabilities for rotating the direction of the two-dimensional scan by controlling a scanning signal for said charged-particle beam, said instrument having image shift capabilities for shifting a range in which said charged-particle beam is scanned, said method comprising the steps of:

displaying a scanned image at an X-Y observational position on the specimen, and displaying being performed at one after the other plural X-Y observational positions including the last observational position, each scanned image having a rotational orientation, respectively;

storing specimen stage X- and Y-direction and rotation information and scan shift and rotation information of said scanned image at each of said plural observational positions;

instructing return from said last observational position to a selected one of the plural observational positions; and automatically moving to said selected observational position and reproducing another image which has the same rotational orientation as the rotational orientation of the previously displayed image at said selected position according to the stored information about the angle of rotation of the image, the amount of shift, and specimen stage X- and Y-direction and rotation information.

4. A scanning charged-particle beam instrument comprising:

means for directing a charged-particle beam to a specimen placed on a specimen stage capable of being mechanically moved in the X- and Y-directions and of being rotated;

means for scanning the charged-particle beam across the specimen in two dimensions;

means for detecting resulting electrons to produce a detector output signal;

means for displaying a scanned image of the specimen at plural X-Y observational positions including the last observational position on the specimen based on the detector output signal, said image having a rotational orientation;

means having scan rotation capabilities for controlling a scanning signal for the charged-particle beam to rotate the direction of the two-dimensional scan;

means having image shift capabilities for controlling a scanning signal for shifting a range in which the charged-particle beam is scanned;

memory for storing specimen stage X- and Y-direction and rotation information at each of said plural X-Y observational positions;

memory for storing scan shift and rotation information of said scanned image at each of said plural observational positions; and control means for instructing return from said last observational position to a prior observational position on the specimen, and controlling the specimen stage, the scan rotation and image shift, based upon data stored in said memories, said control unit controlling in such manner that, if the instruction which instructs to return to a prior observational position is received, the observational position is returned to said prior observational position based on stored information about the stage position and amounts of rotations and shift owing to the scan rotation capabilities and image shift capabilities and for displaying another image as was which has the same rotation orientation as the rotational orientation of the previously displayed image at said prior observational position.

5. A method of observing a specimen image using a scanning charged-particle beam instrument as set forth in claim 3, further comprising the step of displaying the history of observational positions on the image currently being observed, permitting a human operator to select a desired observational position based on the displayed history, and reproducing the image at the selected observational position.

6. A scanning charged-particle beam instrument as set forth in claim 4, wherein history of observational positions is displayed on the image currently being observed to permit a human operator to select a desired one from the displayed observational positions, and wherein the image at the selected desired observational position is reproduced.

7. The method according to claim 1 or 3, wherein the specimen stage X- and Y-direction and rotation information is stored as vectors of stepwise movements from the first to second positions and the scan shift and rotation information is stored as shift and rotation values.

8. The method according to claim 1 or 3, wherein the specimen stage X- and Y-direction and rotation information is stored as coordinates of the first to second positions and the scan shift and rotation information is stored as shift and rotation values.

9. The method according to claim 1 or 3, wherein the specimen stage X- and Y-direction and rotation information is stored as vectors of stepwise movements from the first to second positions or as coordinates of said first and second positions and the scan shift and rotation information is stored as shift and rotation values.

10. The instrument according to claim 2 or 4, wherein the specimen stage X- and Y-direction and rotation information is stored as vectors of stepwise movements from the first to second positions and the scan shift and rotation information is stored as shift and rotation values.

11. The instrument according to claim 2 or 4, wherein the specimen stage X- and Y-direction and rotation information is stored as coordinates of the first to second positions and the scan shift and rotation information is stored as shift and rotation values.

12. The instrument according to claim 2 or 4, wherein the specimen stage X- and Y-direction and rotation information is stored as vectors of the stepwise movements from the first to second positions or as coordinates of said first and second positions and the scan shift and rotation information is stored as shift and rotation values.

* * * * *

UNITED STATES PATENT AND TRADEMARK OFFICE
CERTIFICATE OF CORRECTION

PATENT NO. : 6,727,911 B1
DATED : April 27, 2004
INVENTOR(S) : Yamada et al.

It is certified that error appears in the above-identified patent and that said Letters Patent is hereby corrected as shown below:

Title page,
Item [73], Assignee, "Jeol Ltd." should read -- JEOL Ltd. --.

Column 12,
Line 64, "as was which has" should read -- which has --.

Signed and Sealed this

Twelfth Day of October, 2004

JON W. DUDAS
*Director of the United States Patent and Trademark Office*